United States Patent
Wachter et al.

(10) Patent No.: US 6,191,625 B1
(45) Date of Patent: Feb. 20, 2001

(54) BALANCED LOSS DRIVER CIRCUIT INCLUDING HIGH-SIDE/LOW-SIDE MOS SWITCHES

(75) Inventors: Franz Wachter; Hubert Rothleitner; Johann Massoner, all of Villach (AT)

(73) Assignee: Infineon Technologies AG, Munich (DE)

(*) Notice: Under 35 U.S.C. 154(b), the term of this patent shall be extended for 0 days.

(21) Appl. No.: 09/261,866

(22) Filed: Mar. 3, 1999

(30) Foreign Application Priority Data

Mar. 3, 1998 (DE) ............................................. 198 08 987

(51) Int. Cl.$^7$ ...................................................... H03B 1/00
(52) U.S. Cl. ............................ 327/108; 327/309; 327/512
(58) Field of Search ..................................... 327/108, 109, 327/110, 111, 112, 309, 375, 427, 512, 538, 540, 574; 323/265, 282

(56) References Cited

U.S. PATENT DOCUMENTS

| | | | |
|---|---|---|---|
| 4,384,287 | * 5/1983 | Sakuma | 345/60 |
| 5,534,811 | * 7/1996 | Gist et al. | 327/309 |
| 5,602,724 | * 2/1997 | Balakrishnan | 363/21 |
| 5,796,276 | * 8/1998 | Phillips et al. | 327/108 |

* cited by examiner

Primary Examiner—Timothy P. Callahan
Assistant Examiner—Hai L. Nguyen
(74) Attorney, Agent, or Firm—Herbert L. Lerner; Laurence A. Greenberg; Werner H. Stemer

(57) ABSTRACT

A driver circuit having series-connected high-side and low-side MOS switches with MOS transistors for driving a load, a temperature-limiting circuit and a current-limiting circuit, which is assigned to one of the two MOS transistors. In order to balance power losses between the high-side and low-side MOS switches, provision is made for the gate of the MOS transistor without the current-limiting circuit to be connected to ground via a voltage generator, whose voltage corresponds to a maximum drive voltage for this MOS transistor.

4 Claims, 3 Drawing Sheets

BALANCED LOSS DRIVER CIRCUIT INCLUDING HIGH-SIDE/LOW-SIDE MOS SWITCHES

BACKGROUND OF THE INVENTION

Field of the Invention

The invention relates to a driver circuit having series-connected high-side and low-side MOS switches (M1, M2) with MOS transistors for driving a load, a temperature-limiting circuit and a current-limiting circuit, which is assigned to one of the two MOS transistors.

The driver circuit under discussion is implemented, for example, using BICDMOS (Bipolar C- and D-MOS) technology and is in particular provided for use in automobile electronics, for example in conjunction with airbag applications. In the driver circuit under discussion, with the series-connected high-side and low-side MOS switches for driving a load, for the purpose of driving the respective MOS transistor, which is implemented, for example, using DMOS technology, it is normal to provide circuits which are equipped with specific safety measures, in particular with a temperature limiter and with a current limiter. While each drive circuit for the respective power transistor is equipped with its own temperature limiter, it is usually only one of these drive circuits which is equipped with a current limiter.

It is often demanded of MOS transistors that they have a turn-on resistance $R_{ON}$ of the order of magnitude of about 1.5 ohm. In addition, in particular in conjunction with airbag applications in automobile electronics, it is necessary for the turn-on time of the MOS transistors of greater than 2 milliseconds to be ensured during current limiting operation, the current limiter is typically activated at a current load of approximately 2 A, without the temperature limiter being activated, since within this period of time any thermally induced current "toggling" of the driver stage would prevent the controlled switching of the load. In the case of the airbag application in automobile electronics, failing to satisfy this requirement would mean that the explosion of the detonator for the airbag, and hence the controlled triggering of the latter, would be prevented. In addition, in the case of the application in automobile electronics, there is the risk that the car battery is separated from the on-board network in the event of a collision (load dump), as a result of which a voltage pulse of 40 V in the on-board network is caused, which may lead to overloading of at least one MOS switch of the driver circuit under discussion.

A significant aspect of SPT technology is to keep the chip appropriately small, the factor which determines the area primarily is the power loss which has to be coped with in the MOS transistors. This is particularly critical in the case of using DMOS transistors, which already occupy a relatively large chip area.

SUMMARY OF THE INVENTION

It is accordingly an object of the invention to provide a balanced loss driver circuit including high-side/low-side MOS switches that overcomes the above-mentioned disadvantages of the prior art devices of this general type, in which the power loss of the MOS transistors is reduced without impairing the functional capability of the driver circuit.

With the foregoing and other objects in view there is provided, in accordance with the invention, a driver circuit, including: a high-side MOS switch having a high-side MOS transistor with a gate for driving a load; a first temperature limiting circuit connected to the high-side MOS transistor; a low-side MOS switch having a low-side MOS transistor connected in series with the high-side MOS transistor for driving the load; a second temperature-limiting circuit connected to the low-side MOS transistor; a current-limiting circuit connected to the low-side transistor; and a voltage generator having a first side connected to the gate of the high-side MOS transistor and a second side connected to ground, the voltage generator outputting a voltage corresponding to a maximum drive voltage for the high-side MOS transistor.

In other words, the invention accordingly provides a driver circuit with a balanced distribution of the power loss to both the transistor of the high-side MOS switch and to the transistor of the low-side MOS switch. Balancing the power loss according to the invention is achieved by a surprisingly simple technical measure, specifically by providing a Zener diode or a voltage source for the gate of that MOS transistor in the driver circuit that is not provided with the current limiting circuit. In principle, the MOS transistor equipped with a Zener diode or voltage source according to the invention may be either the low-side transistor or the high-side transistor.

The optimum voltage for the Zener diode or the voltage source under discussion can be determined by computation from parameters of the driver circuit.

Other features which are considered as characteristic for the invention are set forth in the appended claims.

Although the invention is illustrated and described herein as embodied in a balanced loss driver circuit including high-side/low-side MOS switches, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
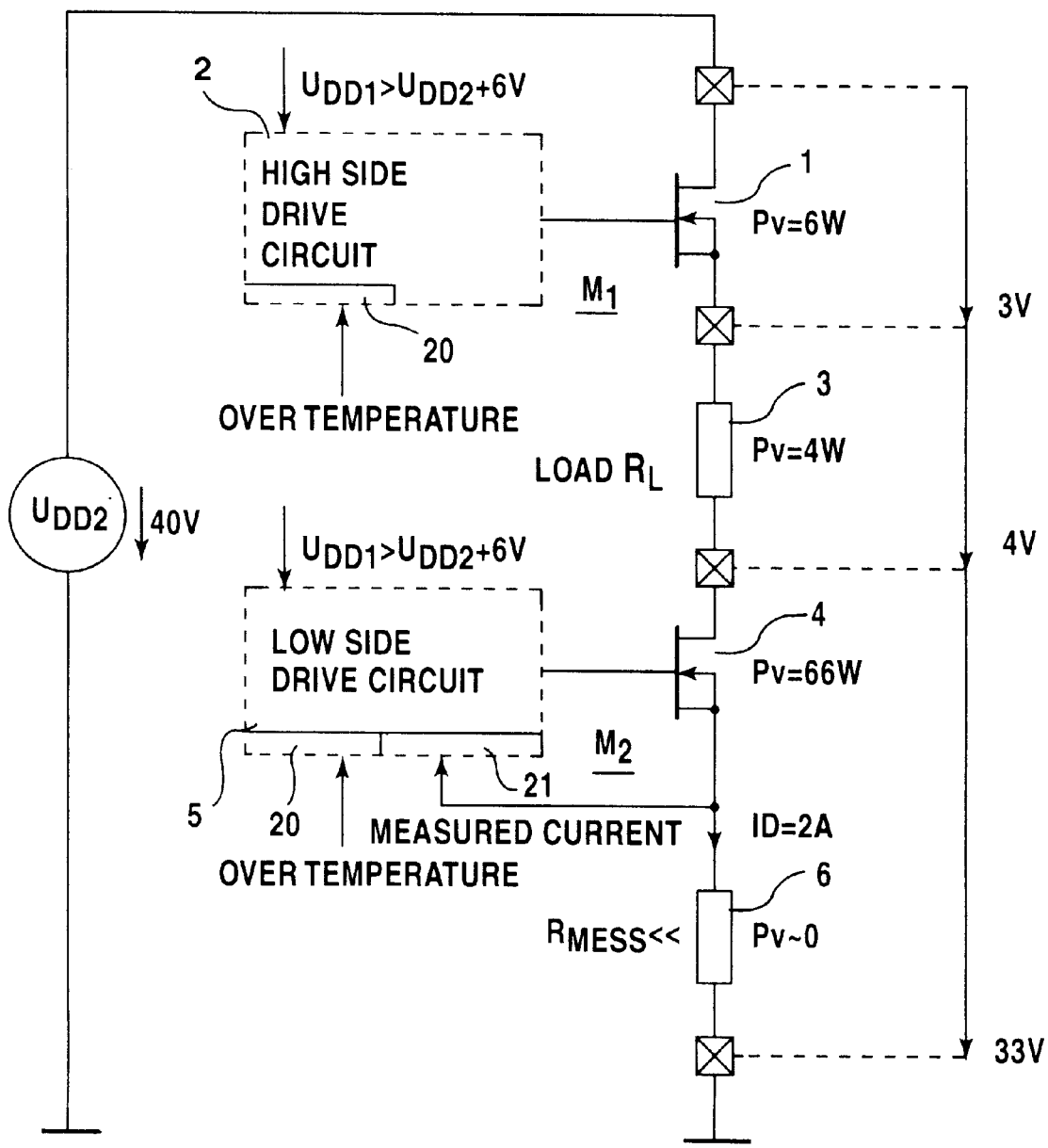
FIG. 1 is a diagrammatic, block circuit diagram of a driver circuit under discussion according to the prior art.

In all the figures of the drawing, sub-features and integral parts that correspond to one another bear the same reference symbol in each case. Referring now to the figures of the drawing in detail and first, particularly, to FIG. 1 thereof, there is shown a conventional, prior art driver circuit.

As FIG. 1 reveals, the driver circuit includes a high-side DMOS switch, designated generally by M1, and a low-side DMOS switch which is connected in series with the former and is generally designated by M2. The high-side DMOS switch M1 includes a DMOS transistor or power transistor 1, whose source is connected to a supply voltage UDD2, whose gate is connected to a drive circuit 2 and whose drain is connected to one terminal of a load resistance 3 which, in the example illustrated, constitutes the detonator of an airbag.

In a similar way, the low-side DMOS switch M2 includes a DMOS transistor or power transistor 4, whose source is connected to the other terminal of the resistance 3, whose gate is connected to a drive circuit 5 and whose drain is connected to a measuring resistor 6, whose other terminal is connected to ground.

The drive circuits 2 and 5 are connected to a supply voltage $U_{DD1}$ greater than $U_{DD2}$+6 V. In addition, each of the drive circuits 2 and 5 is provided with an overtemperature circuit part or a temperature-limiting circuit 20, while only the drive circuit 5 of the low-side DMOS switch M2 also includes a current-limiting feature or a current-limiting circuit 21, whose actuating signal is derived from the current through the measuring resistor 6. In detail, for this purpose a feed line is led from the junction between the power transistor 4 and the measuring resistor 6 to the drive circuit 5.

The high-side DMOS switch M1 is operated in the resistance range, for which reason the power loss PV occurring at the DMOS transistor 1 is calculated as follows to be 6 W if a drain current of $I_D$ of 2 A and a turn-on resistance $R_{ON}$ of 1.5 ohm are used as a basis:

$$P_V(M_1) = I_D^2 \cdot R_{ON}(M_1) = 2^2 \cdot 1.5 = 6 \text{ W} \tag{1}$$

As explained above, the low-side DMOS switch M2 limits the current flowing through the drive circuit 5, for which reason its drain-source voltage is calculated as follows, if a voltage $U_{DD2}$ of 40 V, a drain current $I_D$ of 2 A, a load resistance 3 $R_L$ of 2 ohm, a turn-on resistance $R_{ON}$ of 1.5 ohm are assumed:

$$U_{DS}(M_2) = U_{DD2} - I_D \cdot (R_L + R_{ON}(M_1)) = 40 - 2 \cdot (2+1.5) = 33 \text{V} \tag{2}$$

The power loss of the DMOS transistor 4 is accordingly:

$$P_V(M_2) = I_D \cdot U_{DS}(M_2) = 2 \cdot 33 = 66 \text{ W} \tag{3}$$

The power loss in the load resistance 3 is typically 4 W, while that in the measuring resistor 6 is negligible. Otherwise, the voltage potentials between measuring points in the circuit that are designated by X as shown in FIG. 1.

The DMOS transistor 4 must be able to cope with the power loss of 66 W for at least 2 ms, without the temperature limiter in the drive circuit 5 of the transistor responding, as explained in detail in the introduction for the case of activating an airbag. This requirement cannot be met, or can be met only with difficulty, in view of the further requirement for a low-resistance $R_{ON}$ (=2 ohm). In order to limit the power loss per unit area which occurs in the chip in the DMOS transistor 4 of the low-side switch M2, it is therefore necessary to increase the cell count of the chip for the DMOS transistor 4, for which a penalty in terms of the area of the chip is accepted.

Figure 2:
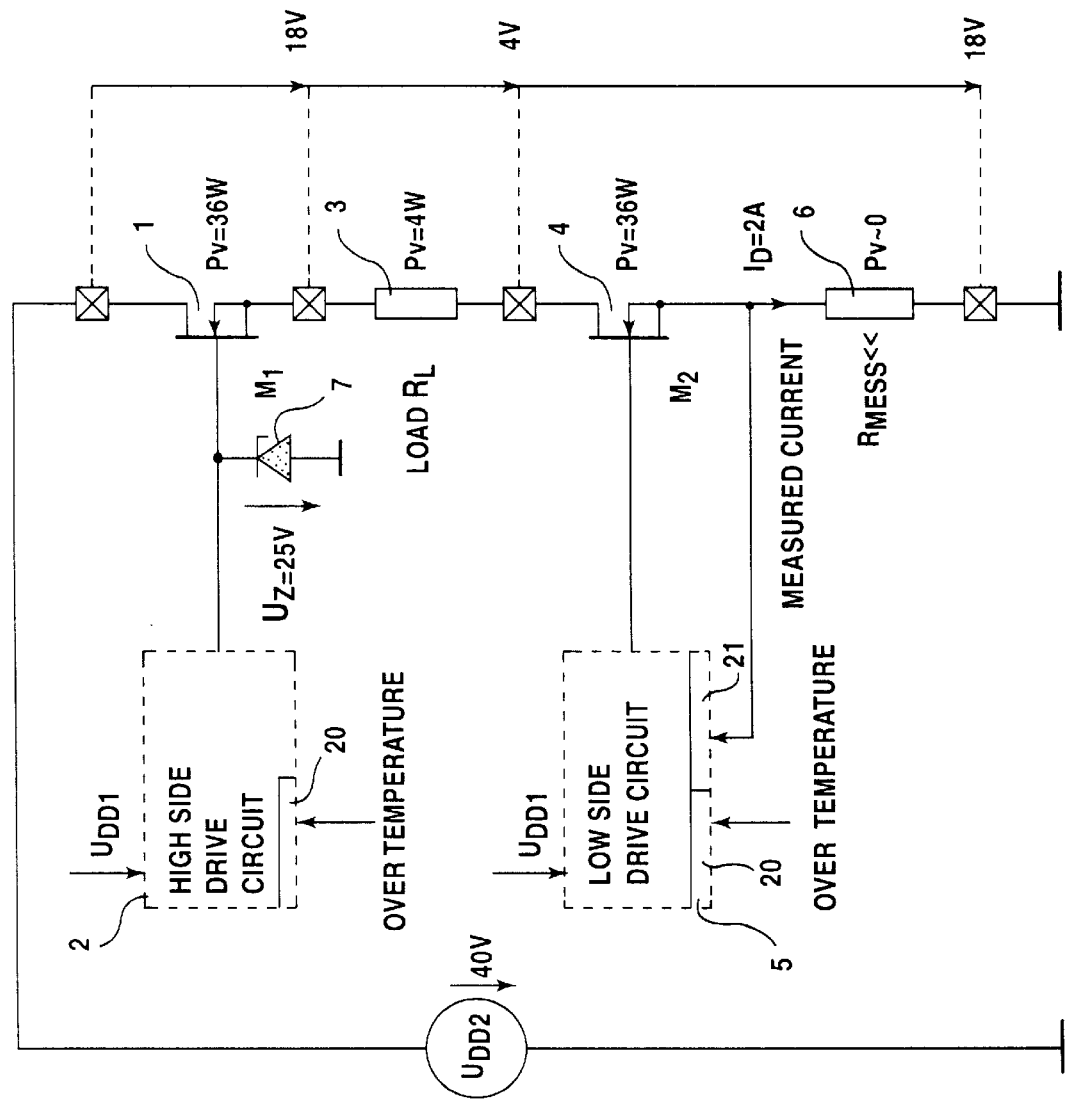
FIG. 2 is a block circuit diagram of a first embodiment of the driver circuit according to the invention.

These disadvantages are overcome by the configuration according to the invention of the driver circuit shown by way of example in FIG. 2. The circuit shown in FIG. 2 essentially corresponds to that of FIG. 1, for which reason the same reference numbers have been used for the same constituents of the circuit and the same symbols have been used to designate the same current and voltage potentials.

In particular, the circuit of FIG. 2 differs from that of FIG. 1 by a Zener diode 7, which is connected to the gate of the DMOS transistor 1 and whose anode is connected to ground.

The drive circuit 2 shown in FIG. 2 corresponds in functional terms to the drive circuit 2 of FIG. 1 for the case in which the voltage $U_{DD1}$ for the drive circuit 2 of the high-side DMOS transistor 1 lies below the breakdown voltage or Zener voltage of the Zener diode 7. If this voltage $U_{DD1}$ is selected to be higher, or if, in the event of a load dump, it rises considerably above the Zener voltage, the gate of the DMOS transistor 1 is clamped to the Zener voltage. The DMOS transistor 1 therefore changes into its saturation range and operates as a source follower. The source of the DMOS transistor 1 therefore experiences clamping to $U_S$, as follows:

$$U_{DS}(M_1) = U_Z - U_{GS}(M_1) = U_Z - U_{Tn} - \sqrt{\frac{2 \cdot I_D}{\beta_n}} \tag{4}$$

where $U_Z$ is the Zener voltage, $U_{GS}$ is the gate-source voltage of the DMOS transistor 1, $U_{Tn}$ is the threshold voltage of the DMOS transistor 1, $I_D$ is the drain current of the transistor 1 and $\beta_n$ is the gain of the transistor 1.

Depending on the selection of the Zener voltage of the Zener diode 7, a uniform distribution of the power loss to the two DMOS transistors 1 and 4 can therefore be achieved as a function of the current limiting value $I_D$, the threshold value $U_{Tn}$ of the DMOS transistor 1 and of its gain $\beta_n$.

The power loss of the two DMOS transistors 1 and 4 is accordingly PV(M1)=PV(M2); that is:

$$U_{DS}(M_1) = U_{DS}(M_2) = (U_{DD2} + I_D \cdot R_L)/2 \tag{5}$$

from which, together with Equation (4), the optimum Zener voltage of the Zener diode 7 for the case of a balanced power loss can be calculated as follows:

$$U_Z = \frac{U_{DD2} + I_D \cdot R_L}{2} + U_{Tn} + \sqrt{\frac{2 \cdot I_D}{\beta_n}} \tag{6}$$

Because of the balanced division of the loss, which can be achieved according to the invention by the Zener diode 7, to the two DMOS transistors 1, 4 of the driver circuits 2, 5 (in each case 36 W), it is ensured that the DMOS transistor 4 of the low-side switch is relieved considerably by comparison with the circuit of FIG. 1, specifically to the benefit of an additional load on the DMOS transistor 1 of the high-side switch M1, but to an extent which is tolerable by this transistor.

The voltage potentials between the measuring points of the circuit denoted by X are also marked in FIG. 2.

The invention is not restricted to the circuit shown in FIG. 2. Instead, the Zener diode 7 can also be connected to the gate of the low-side switch transistor 4. In this case, current limiting is expediently achieved by the drive circuit 2 for the high-side transistor 1.

Figure 3:
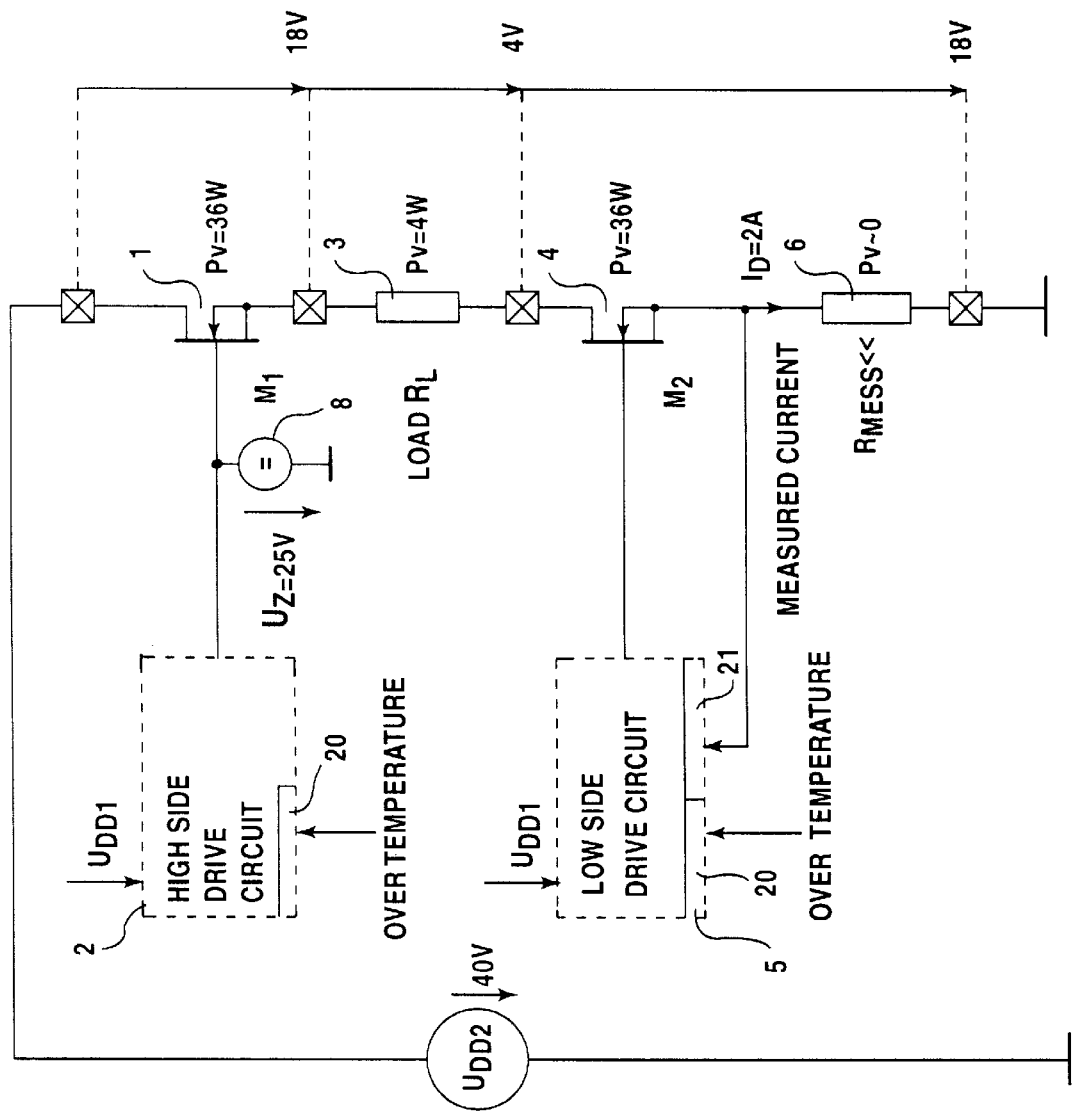
FIG. 3 is a block circuit diagram of a second embodiment of the driver circuit.

Any desired clamping circuit may be used instead of the Zener diode 7. The clamping circuit is advantageously configured as a voltage source 8, as illustrated in FIG. 3. The remaining construction of the balanced loss driver circuit otherwise does not differ from the embodiment of FIG. 2.

We claim:

1. A driver circuit, comprising:
   a high-side MOS switch having a high-side MOS transistor with a gate for driving a load;
   a first temperature limiting circuit connected to said high-side MOS transistor;
   a low-side MOS switch having a low-side MOS transistor connected in series with said high-side MOS transistor for driving the load;
   a second temperature-limiting circuit connected to said low-side MOS transistor;

a current-limiting circuit connected to said low-side transistor; and a Zener diode having a first side connected to said gate of said high-side MOS transistor and a second side connected to ground, said Zener diode outputting a voltage $U_Z$ corresponding to a maximum drive voltage for said high-side MOS transistor, said voltage $U_Z$ defined, at least approximately, as follows:

$$U_Z = \frac{U_{DD2} + I_D R_L}{2} + U_{Tn} + \sqrt{\frac{2I_D}{\beta_n}}$$

where $U_{DD2}$ is a drive voltage of said high-side MOS transistor connected to said Zener diode, $I_D$ is a drain current of said high-side MOS transistor, $R_L$ is a resistance of the load to be driven, $U_{Tn}$ is a threshold voltage of said high-side MOS transistor, and $\beta_n$ is a gain of said high-side MOS transistor.

2. The driver circuit according to claim 1, wherein said high-side MOS transistor is a high-side DMOS transistor and said low-side MOS transistor is a low-side DMOS transistor.

3. A driver circuit, comprising:

a high-side MOS switch having a high-side MOS transistor for driving a load;

a first temperature limiting circuit connected to said high-side MOS transistor;

a current-limiting circuit connected to said high-side transistor;

a low-side MOS switch having a low-side MOS transistor with a gate and connected in series with said high-side MOS transistor for driving the load;

a second temperature-limiting circuit connected to said low-side MOS transistor; and a Zener diode having a first side connected to said gate of said low-side MOS transistor and a second side connected to ground, said Zener diode outputting a voltage $U_Z$ corresponding to a maximum drive voltage for said low-side MOS transistor, said voltage $U_Z$ defined, at least approximately, as follows:

$$U_Z = \frac{U_{DD2} + I_D R_L}{2} + U_{Tn} + \sqrt{\frac{2I_D}{\beta_n}}$$

where $U_{DD2}$ is a drive voltage of said low-side MOS transistor connected to said Zener diode, $I_D$ is a drain current of said low-side MOS transistor, $R_L$ is a resistance of the load to be driven, $U_{Tn}$ is a threshold voltage of said low-side MOS transistor, and $\beta_n$ is a gain of said low-side MOS transistor.

4. The driver circuit according to claim 3, wherein said high-side MOS transistor is a high-side DMOS transistor and said low-side MOS transistor is a low-side DMOS transistor.

* * * * *